United States Patent
Chung et al.

(10) Patent No.: US 10,178,773 B2
(45) Date of Patent: Jan. 8, 2019

(54) METHOD FOR MANUFACTURING A METAL PRINTED CIRCUIT BOARD

(71) Applicant: INKTEC CO., LTD., Ansan-si (KR)

(72) Inventors: Kwang-Choon Chung, Yongin-si (KR);
Nam Boo Cho, Anyang-si (KR);
Young-Koo Han, Bucheon-si (KR);
Myung Bong Yoo, Yongin-si (KR);
Woong Ku On, Siheung-si (KR)

(73) Assignee: INKTEC CO., LTD., Ansan-si (KR)

( * ) Notice: Subject to any disclaimer, the term of this patent is extended or adjusted under 35 U.S.C. 154(b) by 249 days.

(21) Appl. No.: 14/367,492

(22) PCT Filed: Dec. 24, 2012

(86) PCT No.: PCT/KR2012/011358
§ 371 (c)(1),
(2) Date: Jun. 20, 2014

(87) PCT Pub. No.: WO2013/095075
PCT Pub. Date: Jun. 27, 2013

(65) Prior Publication Data
US 2014/0338192 A1 Nov. 20, 2014

(30) Foreign Application Priority Data
Dec. 23, 2011 (KR) .................. 10-2011-0141309
Dec. 21, 2012 (KR) .................. 10-2012-0151216

(51) Int. Cl.
*H05K 3/00* (2006.01)
*H05K 3/20* (2006.01)

(52) U.S. Cl.
CPC .......... *H05K 3/007* (2013.01); *H05K 3/0014* (2013.01); *H05K 3/0061* (2013.01); *H05K 3/207* (2013.01);
(Continued)

(58) Field of Classification Search
CPC ...... H05K 3/12; H05K 3/0014; H05K 3/0061; H05K 3/207; H05K 3/38; H05K 3/007; H05K 2201/0376; Y10T 29/49155
See application file for complete search history.

(56) References Cited

U.S. PATENT DOCUMENTS 4,722,765 A * 2/1988 Ambros .................. H01L 24/96
156/233
5,354,415 A * 10/1994 Fushii ...................... H05K 3/06
216/108
(Continued)

FOREIGN PATENT DOCUMENTS

EP     0961533 A2 * 12/1999 ............... H05K 3/40
JP     62291990        12/1987
(Continued)

*Primary Examiner* — Peter DungBa Vo
*Assistant Examiner* — Jeffrey Carley
(74) *Attorney, Agent, or Firm* — Cantor Colburn LLP

(57) ABSTRACT

Provided is a method for manufacturing a metal printed circuit board, the method including: printing a circuit pattern on a release film; applying a heat conductive insulating layer on the circuit pattern; laminating a heat conductive base layer on the heat conductive insulating layer and hot pressing the laminated heat conductive base layer and the heat conductive insulating layer; and removing the release film therefrom.

6 Claims, 1 Drawing Sheet

(52) U.S. Cl.
CPC . *H05K 2201/0376* (2013.01); *Y10T 29/49155* (2015.01)

(56) References Cited

U.S. PATENT DOCUMENTS

| | | | | |
|---|---|---|---|---|
| 5,407,511 | A | * | 4/1995 | Nakatani ............... C04B 35/583 156/230 |
| 5,667,884 | A | * | 9/1997 | Bolger .................. H01L 21/563 156/320 |
| 2002/0096759 | A1 | | 7/2002 | Hirano et al. |
| 2008/0316714 | A1 | * | 12/2008 | Eichelberger ....... H01L 21/6835 361/728 |
| 2009/0123732 | A1 | * | 5/2009 | Yukinobu ............... H05K 3/102 428/328 |
| 2014/0027047 | A1 | * | 1/2014 | Lee .......................... B32B 7/04 156/182 |

FOREIGN PATENT DOCUMENTS

| | | | | |
|---|---|---|---|---|
| JP | H07283534 | A | * 4/1994 | ............ B32B 15/08 |
| JP | 09074264 | | 3/1997 | |
| JP | 2003138244 | | 5/2003 | |
| JP | 2003243563 | | 8/2003 | |
| JP | 2006328352 | | 12/2006 | |
| JP | 2007084705 | | 4/2007 | |
| JP | 2010-027745 | | * 2/2010 | ............... H05K 3/46 |
| JP | 2011009475 | | 1/2011 | |
| KR | 1020020023667 | | 3/2002 | |
| KR | 200404237 | | 12/2005 | |
| KR | 1020060080338 | | 7/2006 | |
| KR | 100850760 | | 7/2008 | |
| KR | 101022873 | | 3/2011 | |
| TW | 200950631 | | 12/2009 | |

\* cited by examiner

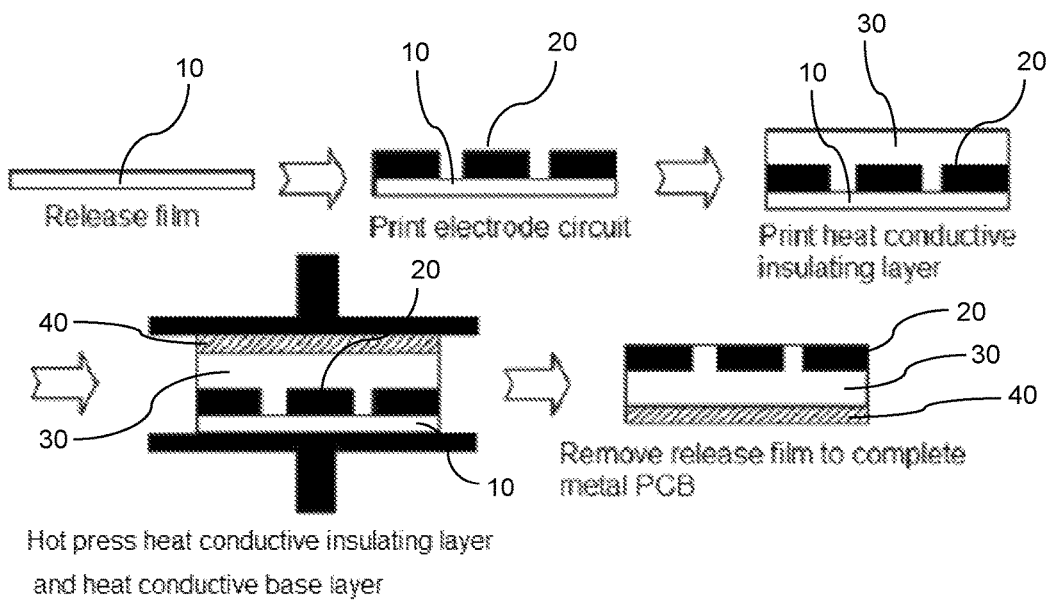

METHOD FOR MANUFACTURING A METAL PRINTED CIRCUIT BOARD

TECHNICAL FIELD

The present invention relates to a method for manufacturing a metal printed circuit board, and more particularly, to a method for manufacturing a metal printed circuit board manufactured by forming a circuit pattern and a heat conductive insulating layer on a release film using a printing method and hot pressing the formed circuit pattern and the insulating layer together with a heat conductive base layer.

BACKGROUND ART

A light emitting diode (hereinafter, referred to as an LED) has various colors in a form of a point source of light to be initially used as a simple display device but has been gradually used in various fields such as a monitor of a laptop/desktop computer and an area display device, or the like, due to advantages such as light optical efficiency, long lifespan, or the like. Particularly, recently, a usage range of the LED has been gradually enlarged up to fields of illumination and a liquid crystal display (LCD) television (TV) backlight.

In the case of the LCD TV backlight and LED illumination, a plurality of light emitting devices configures an array on a board to be used due to high brightness per unit area and flat luminescence. In this array configuration, it is significantly important factor in maintaining a lifespan and quality of the LED to effectively radiate heat generated from LED.

As the LED array board, for smooth heat-radiation, a metal core printed circuit board (MCPCB) is used instead of a copper clad lamination (CCL) used in a PCB according to the related art. Generally, this MCPCB has a three layer structure configured of a metal base layer, a dielectric layer, and a copper foil.

The dielectric layer may be made of an epoxy resin filled with heat conductive particles in order to increase heat conductivity. An electrode circuit may be manufactured by forming a resist pattern and etching the board using a lithography technology similarly to the PCB according to the related art. However, the etching process for forming the electrode circuit is significantly complicated, and a large amount of waste etchant may be generated during the process. In addition, in the LED board based on the MCPCB, heat radiation performance may be significantly limited due to the epoxy dielectric layer.

A technology of forming an electrode circuit by etching using an MCPCB, forming an opening part from a portion on which an LED is mounted to an insulating layer, attaching heat-sink slug thereto, and mounting other LED members thereon has been disclosed in Korean Utility Model No. 20-0404237. However, it may be difficult to clearly detach the attached insulating layer, this technology runs counter to the trend of the assembly scheme as described above, and economic feasibility thereof is low.

An LED array board in which only LED chips are extracted and mounted on a separate board configured of a depressed-mounting part, an insulating layer, a bonding die, a reflector, and an electrode, without using a packaged LED, has been disclosed in Korean Patent No. 696063 (Patent Document 1). However, this board may not have a united standard in terms of the characteristics of the board, complicate processes such as a machining process, various layers forming processes, a pattern forming process, a directly molding process on the board, should be performed. In addition, this board runs counter to the trend of the assembly scheme, and economic feasibility thereof is low.

DISCLOSURE

Technical Problem

An object of the present invention is to provide a method for manufacturing a metal printed circuit board having excellent electric properties and adhesive force by forming a circuit pattern and a heat conductive insulating layer on a release film using a printing method and hot pressing the formed circuit pattern and heat conductive insulating layer together with a heat conductive base layer, unlike the existing method in which electric properties and adhesive force between each of the materials are deteriorated since a metal printed circuit board is manufactured by sequentially printing an insulating coating and electrode circuit on a heat conductive base layer.

Technical Solution

In one general aspect, a method for manufacturing a metal printed circuit board includes: printing a circuit pattern on a release film; applying a heat conductive insulating layer on the circuit pattern; laminating a heat conductive base layer on the heat conductive insulating layer and hot pressing the laminated heat conductive base layer and the heat conductive insulating layer; and removing the release film.

Advantageous Effects

As described above, according to the present invention, the circuit pattern and the heat conductive insulating layer are formed on the release film using the printing method and hot pressed together with the heat conductive base layer, such that the method for manufacturing a metal printed circuit board having the excellent electric properties and adhesive force may be provided. More specifically, according to the present invention, the metal printed circuit board capable of forming the insulating layer in a state in which excellent conductivity of the cured metal paste is maintained at the time of forming the circuit pattern, maintaining high conductivity, providing high adhesive force, and minimizing damage such as cracks cause by thermal expansion of different materials due to the existing individual curing, or the like may be provided.

DESCRIPTION OF DRAWINGS

FIG. 1 is a view showing a process for manufacturing a metal printed circuit board according to an exemplary embodiment of the present invention.

BEST MODE

A method for manufacturing a metal printed circuit board according to an exemplary embodiment of the present invention may include: printing a circuit pattern 20 on a release film 10; applying a heat conductive insulating layer 30 on the circuit pattern 20; laminating a heat conductive base layer 40 on the heat conductive insulating layer 30 and hot-pressing them; and removing the release film 10. For example, as shown in FIG. 1, the circuit pattern 20 is printed on the release film 10, the heat conductive insulating layer 30 is applied thereon, the heat conductive base layer 40 is laminated thereon and hot pressed, and then the release film 10 is removed, such that the metal printed circuit board according to the exemplary embodiment of the present invention may be manufactured.

As the release film 10, a release coated film of which release force is adjusted may be used, wherein this release coated film may be manufactured by applying a releasing agent onto a heat resistance film.

The heat resistance film may be a film made of polyethylenenaphthalate (PEN), polyethyleneterephthalate (PET), polyethylene (PE), polyimide (PI), polycarbonate (PC), or aluminum (Al), but is not limited thereto. That is, a heat resistance film made of various materials known in the art may be used.

As the releasing agent, a silicone or acrylic releasing agent may be used, wherein the silicone releasing agent has heat-resistance characteristics that prevent excessive shrinkage during a hot-press process, and the releasing force thereof may be easily adjusted. In addition, various kinds of releasing agents known in the art may be used.

The releasing agent may be applied using a micro gravure method, a gravure method, a slot die method, a reverse kiss method, or rotary screen coating method. In addition, various methods capable of applying the releasing agent in the art may be used.

The circuit pattern 20 is a conductive printed circuit pattern formed by printing a metal paste by a printing method, wherein the printing method may be a gravure printing method, a flexo printing method, an offset printing method, a screen printing method, a rotary screen printing method, or an inkjet printing method, but is not limited thereto. That is, the circuit pattern 20 may be printed by various methods in the art.

The circuit pattern 20 may be made of the metal paste. More specifically, the circuit pattern 20 may be formed using a metal having excellent electric conductivity such as silver (Ag), copper (Cu), silver/copper (Ag/Cu), tin (Sn), silver/copper/Zinc (Ag/Cu/Zn), gold (Au), nickel (Ni), aluminum (Al), or the like, or ink prepared by coating or doping the metal or using an alloy of the metal.

As a specific example, the circuit pattern 20 may be formed by performing the printing and heat-treatment using Ag complex, Ag salts, Ag-acid/base complex, or the like, which is Ag transparent electronic ink. As another example, the circuit pattern 20 may be formed by performing the printing and heat-treatment using Ag Nano paste, Ag Flake paste, or Ag Granule paste. In this case, the curing by ultraviolet light or e-beam may be performed as well as curing by the heat-treatment.

The ink forming the circuit pattern 20 is not limited to the above-mentioned ink, but any ink may be used as long as the ink may have conductivity and be printed by a printing method.

As another example of the method for forming the circuit pattern 20, the method may include a primary printing operation of printing a primary circuit pattern and a secondary printing operation of printing a secondary circuit pattern on the primary pattern, thereby printing the circuit pattern while controlling a position. More specifically, the primary and secondary circuit patterns are sequentially printed, such that more precise pattern may be implemented.

The circuit pattern 20 may be formed by a method of depositing or sputtering Al, Ag, Cu, Ni, or the like, which is a electric conductive metal, using a mask pattern, as well as the above-mentioned method.

Meanwhile, the method for manufacturing a metal printed circuit board may further include plating a metal on the circuit pattern 20 between the printing of the circuit pattern 20 and the applying of the heat conductive insulating layer 30, wherein in the plating of the metal, electro-plating or electroless plating may be performed.

As described above, the circuit pattern 20 may be used alone. Alternately, since a plating thickness of the plated copper may be adjusted according to an amount of current applied thereto, the circuit may maintain only characteristics of a seed layer.

Here, a circuit of the printed circuit board may be formed by printing ink including a catalyst such as Palladium (Pd) colloid, palladium chloride ($PdCl_2$), or the like, so as to correspond to the circuit pattern and then performing electroless copper plating or nickel plating. In addition, in the case of using high capacity LED having a large current consumption amount, the electro copper plating may be performed at an appropriated thickness according to the current consumption amount.

As described above, electric conductivity may be increased using the electro-plating method, the electroless plating method, a deep coating method, or the like, as the plating method. A metal used in the plating is not limited, but copper may be preferable. The deep coating method may be preferable in the case of using tin (Sn) or zinc (Zn). Nickel (Ni), tin (Sn), palladium (Pd), zinc (Zn), silver (Ag), gold (Au), or the like, may be variously used as well as copper (Cu).

The heat conductive insulating layer 30 may be made of a coating solution for a heat conductive insulating layer as a thermosetting coating resin ink. Here, the coating solution may be cured by UV light using a UV coating resin instead of the thermosetting resin, and other various cross-linking reactions may be performed. In addition, a resin composition is not limited. However, the resin composition having heat-resistance and atmospheric corrosion resistance may be preferable. In addition, in the case of using a metal flake having high electric conductivity, it is preferable that the metal flake is surface-treated so as to have electric insulating property and heat conductivity.

For example, as the resin used in the heat conductive insulating layer 30, an epoxy resin, a urethane resin, a urea resin, a melamine resin, a phenol resin, a silicone resin, a polyimide resin, a polysulfone resin, a polyester resin, a polyphenylene sulfide resin, or the like, may be used. In addition, a heat cross-linking type resin may be preferably used, but is not necessarily limited thereto.

A UV curable resin or a radical polymer type resin may also be used, and any resin may be used as long as the resin has excellent heat resistance and atmospheric corrosion resistance, and at least one selected from modified materials thereof may be used.

The heat conductive insulating layer 30 may further include a filler selected among silicone dioxide ($SiO_2$), titanium dioxide ($TiO_2$), alumina ($Al_2O_3$), barium sulfate ($BaSO_4$), calcium carbonate ($CaCO_3$), Al flake, Ag flake, graphene oxide, graphite oxide, oxidized carbon nanotubes, indium tin oxide (ITO), aluminum nitride (AlN), boron nitride (BN), and magnesium oxide (MgO), in addition to the resin. Here, in the case of Al flake or Ag flake, Al flake or Ag flake coated with an insulating resin may be preferable. However, the filler is not limited thereto.

As an example of the coating solution for a heat conductive insulating layer 30, the solution may be prepared by mixing and dispersing a bisphenol A-type modified epoxy resin, a phenol novolac epoxy resin, hexahydrophthalic anhydride, quaternary ammonium salts, alumina, a dispersant, and a solvent (methylethylketone (MEK)), but the present invention is not limited thereto.

The heat conductive insulating layer 30 may be applied by a S-knife coating method, a gravure coating method, a flexo coating method, a screen coating method, a rotary screen coating method, a slot die coating method, or a micro gravure coating method.

In this case, the heat conductive insulating layer 30 may be formed as a single layer, or primary and secondary heat conductive insulating layers may be formed.

More specifically, the heat conductive insulating layer 30 may be formed by performing a primary applying operation of applying a primary heat conductive insulating layer on the circuit pattern and a secondary applying operation of applying a secondary heat conductive insulating layer on the primary heat conductive insulating layer.

Here, the primary applying operation may be performed by the method selected from the micro gravure coating method, the S-knife coating method, the gravure coating method, the flexo coating method, the screen coating method, and the rotary screen coating method.

The secondary applying operation may be performed by the method selected from the slot die method, the S-knife coating method, and the micro gravure coating method. However, the present invention is not necessarily limited thereto.

More specifically, in the case of the primary applying operation, the entire surface of the circuit pattern may be coated by the coating method such as the micro gravure coating method, the flexo coating method, the screen coating method, and the rotary screen coating method. In addition, in the copper-plated printed circuit board, since a step of the surface may be large, in the case of using a slot die coater or an S-knife coater in the secondary applying operation, surface roughness may become uniform. Here, in the case in which uniformity of the surface is not secured even though the heat conductive insulating layer is primarily applied, or the heat conductive insulating layer needs to have a thick thickness, it may be preferable that the secondary application of the heat conductive insulating layer is performed by the slot die method, the S-knife coating method, and the micro gravure coating method. Further, in order to optimize heat radiation characteristics and insulation characteristics, it may be preferable that two-step application is performed as described above.

As the heat conductive base layer 40, a hot-rolled steel sheet, a cold-rolled steel sheet, an aluminum plate, a zinc plating plate, a copper plate, a stainless plate, a tin plating plate, a brass plate, or a resin-coated steel plate may be used, but is not necessarily limited thereto. A heat radiation plate made of various material used in the art may be used.

For example, in order to be laminated with the heat conductive base layer 40 such as aluminum (Al) plate, it may be preferable that after the heat conductive insulating layer 30 is formed in a B-stage state, which is a semi-cured state, the heat conductive insulating layer and the heat conductive base layer 40 are laminated with each other.

In the laminating of the heat conductive base layer 40 on the heat conductive insulating layer 30 and hot-pressing them, the hot-pressing may be performed at 120 to 200° C., more preferably, 140 to 175° C.

Meanwhile, as described above, each of the operations of the method for manufacturing a metal printed circuit board according to the exemplary embodiment of the present invention may be performed by a roll to roll continuous process. In this case, a production rate may be increased, such that production efficiency may be increased.

Hereinafter, the present invention will be specifically described through Examples and Comparative Examples, but the present invention is not limited thereto.

Example 1

After a circuit pattern 20 was printed on a heat resistant silicone release coated film (Biovision Chem., MR-50) as a release film 10 using an Ag paste (Inktec Co., Ltd. TEC-PF-021) by a screen printing method (Tokai-seiki Co., SFA-RR350), the printed circuit pattern was dried at 150° C. for 5 minutes, thereby forming a circuit pattern 20 at a thickness of 1 µm.

A coating solution for a heat conductive insulating layer 30 (Table 1) was coated as a thermosetting coating resin ink on the circuit pattern using a slot die coater (Pactive Co.) at a dried thickness of 50 µm, thereby forming a heat conductive insulating layer.

Here, a composition of the coating solution for a heat conductive insulating layer 30 is shown in Table 1.

TABLE 1

| | | Formulation | | |
|---|---|---|---|---|
| Material | | Manufacturer | Model name (or material name) | Content (%) |
| Resin | A | Printec Co., LTD | EPOX-AH357A | 10% |
| | B | Hitachi Chemical | KH-LT-X | 5% |
| | C | Mitsubishi Gas Chemical company Inc. | H-TMAn | 4% |
| | D | New Japan Chemical Co., LTD | RIKACID MH700G | 1% |
| Heat conductive particles | A | ASUZAC INC | AR-4N | 50% |
| | B | SHOWA DENKO | AL-250 | 10% |
| Solvent | | SAMCHUN CHEMICAL | MEK(Methyl Ethyl Ketone) | 20% |
| Sum | | | | 100% |

An aluminum plate (Sejong Materials. AL5052) having a thickness of 1.5 mm was laminated on the heat conductive insulating layer 30 as a heat conductive base layer 40 and hot-pressed using a hot press at 170° C. for 60 minutes, followed by removing the heat resistant silicone release coated film therefrom, thereby manufacturing a metal printed circuit board.

Example 2

After a circuit pattern 20 was printed on a heat resistant silicone release coated film (Biovision Chem., MR-50) as a release film 10 using an Ag paste (Inktec Co., Ltd. TEC-PF-021) by a screen printing method (Tokai-seiki Co., SFA-RR350), the printed circuit pattern was dried at 150° C. for 5 minutes, thereby forming a circuit pattern 20 at a thickness of 1 µm.

A coating solution for a heat conductive insulating layer (Table 1) was coated as a thermosetting coating resin ink on the circuit pattern 20 using a slot die coater (Pactive Co.) at a dried thickness of 100 µm, thereby forming a heat conductive insulating layer.

An aluminum plate (Sejong Materials. AL5052) having a thickness of 1.5 mm was laminated on the heat conductive insulating layer 30 as a heat conductive base layer 40 and hot-pressed using a hot press at 170° C. for 90 minutes, followed by removing the heat resistant silicone release coated film therefrom, thereby manufacturing a metal printed circuit board.

Example 3

After a circuit pattern 20 was printed on a heat resistant silicone release coated film (Biovision Chem. MR-50) as a release film 10 using an Ag paste (Inktec Co, Ltd. TEC-PF-021) by a screen printing method (Tokai-seiki Co. SFA-RR350), the printed circuit pattern was dried at 150° C. for 5 minutes, thereby forming a circuit pattern at a thickness of 2 μm.

A coating solution for a heat conductive insulating layer 30 (Table 1) was coated as a thermosetting coating resin ink on the circuit pattern using a slot die coater (Pactive Co.) at a dried thickness of 100 μm, thereby forming a heat conductive insulating layer.

An aluminum plate (Sejong Materials. AL5052) having a thickness of 1.5 mm was laminated on the heat conductive insulating layer 30 as a heat conductive base layer 40 and hot-pressed using a hot press at 170° C. for 90 minutes, followed by removing the heat resistant silicone release coated film therefrom, thereby manufacturing a metal printed circuit board.

Comparative Example 1

A coating solution for a heat conductive insulating layer (Table 1) was coated as a thermosetting coating resin ink on an aluminum plate (Sejong Materials. AL5052) having a thickness of 1.5 mm as a heat conductive base layer using a slot die coater (Pactive Co.) at a dried thickness of 50 μm, thereby forming a heat conductive insulating layer.

Next, a circuit pattern was printed on the heat conductive insulating layer using an Ag paste (Inktec Co., Ltd. TEC-PF-021) by a screen printing method (Tokai-seiki Co. SFA-RR350), and then the printed circuit pattern was dried at 150° C. for 5 minutes, such that the circuit pattern having a thickness of 1 μm was formed. Then, a heat resistant silicone release coated film (Biovision Chem. MR-50) as a release film was laminated thereon and hot-pressed using a hot press at 170° C. for 60 minutes, followed by removing the heat resistant silicone release coated film therefrom, thereby manufacturing a metal printed circuit board.

Comparative Example 2

A coating solution for a heat conductive insulating layer (Table 1) was coated as a thermosetting coating resin ink on an aluminum plate (Sejong Materials. AL5052) having a thickness of 1.5 mm as a heat conductive base layer using a slot die coater (Pactive Co.) at a dried thickness of 100 μm, thereby forming a heat conductive insulating layer.

Next, a circuit pattern was printed on the heat conductive insulating layer using an Ag paste (Inktec Co, Ltd. TEC-PF-021) by a screen printing method (Tokai-seiki Co. SFA-RR350), and then the printed circuit pattern was dried at 150° C. for 20 minutes, such that the circuit pattern having a thickness of 2 μm was formed. Then, a heat resistant silicone release coated film (Biovision Chem. MR-50) as a release film was laminated thereon and hot-pressed using a hot press at 170° C. for 90 minutes, followed by removing the heat resistant silicone release coated film therefrom, thereby manufacturing a metal printed circuit board.

Experimental Example

1) Measuring Method

In each of the metal printed circuit boards manufactured according to Examples and Comparative Examples, the thicknesses of the circuit pattern and the heat conductive insulating layer after drying were measured using a non-contact 3D video measuring machine (NANO SYSTEM Co. NV-p1010), and the conductivity was indicated as an average value calculated after sheet resistance was measured using a sheet resistance meter [MITSUBISHI CHEMICAL ANALYTECH, Laresta-GP MCP-610 (4 probe Type)]. In addition, the adhesive force was measured by a method of cutting the manufactured metal printed circuit board by 100 EA/1 cm2 using a cross-cutter (YOSHIMITUSU Co. MR-YCC1) and using an adhesive tape (3M Co. 810) to measure an amount of the cut pieces detached from the adhesive tape. The results are shown in Table 2.

2) Measuring Results

TABLE 2

|  | Example 1 | Example 2 | Example 3 | Comparative Example 1 | Comparative Example 2 |
|---|---|---|---|---|---|
| Thickness of Ag paste (after drying) | 1 μm | 1 μm | 2 μm | 1 μm | 2 μm |
| Thickness of insulating layer (after drying) | 50 μm | 100 μm | 100 μm | 50 μm | 100 μm |
| Base layer (aluminum plate) | 1.5 mm | 1.5 mm | 1.5 mm | 1.5 mm | 1.5 mm |
| Adhesive force | 5B | 5B | 5B | 2B | 3B |
| conductivity | $211 \times 10^{-3} \Omega$ | $227 \times 10^{-3} \Omega$ | $206 \times 10^{-3} \Omega$ | $850 \times 10^{-3} \Omega$ | $783 \times 10^{-3} \Omega$ |

As shown in Table 2, in the case of manufacturing the metal printed circuit board according to Comparative Examples 1 and 2, efficiency was reduced by 75% due to impregnation of an electrode forming solution into the heat conductive insulating layer. However, in the case in which according to the present invention, the circuit pattern 20 and the heat conductive insulating layer 30 were formed on the release film 10 using the printing method and hot pressed together with the heat conductive base layer 40, basic electric properties of the electrode circuit may be maintained at a level of 90% or more. In addition, high adhesive force may be secured.

As described above, according to the present invention, the circuit pattern 20 and the heat conductive insulating layer 30 are formed on the release film 10 using the printing method and hot pressed together with the heat conductive base layer 40, such that the method for manufacturing a metal printed circuit board having the excellent electric properties and adhesive force may be provided. More specifically, according to the present invention, the metal printed circuit board capable of forming the insulating layer in a state in which excellent conductivity of the cured metal paste is maintained at the time of forming the circuit pattern, maintaining high conductivity, providing high adhesive force, and minimizing damage such as cracks cause by thermal expansion of different materials due to the existing individual curing, or the like may be provided.

The invention claimed is:

1. A method for manufacturing a metal printed circuit board, the method comprising:
    preparing a release film;
    printing a circuit pattern on the release film, wherein the printing comprises: printing the circuit pattern using a metal paste and using a gravure printing method, a flexo printing method, an offset printing method, a screen printing method, a rotary screen printing method, or an inkjet printing method;
    applying a liquid-phased coating solution for a heat conductive insulating layer on the circuit pattern to form the heat conductive insulating layer covering the circuit pattern entirely, wherein the liquid-phased coating solution for the heat conductive insulating layer is a thermosetting coating resin ink including a resin and heat conductive particles, and applied by an S-knife coating method, a gravure coating method, a flexo coating method, a screen coating method, a rotary screen coating method, a slot die coating method, or a micro gravure coating method;
    laminating a heat conductive base layer on the heat conductive insulating layer, wherein the heat conductive insulating layer is in a semi-cured state, wherein the heat conductive base layer is a hot-rolled steel sheet, a cold-rolled steel sheet, an aluminum plate, a zinc plating plate, a copper plate, a stainless plate, a tin plating plate, a brass plate, or a resin-coated steel plate; and
    hot pressing the laminated heat conductive base layer, the heat conductive insulating layer, the circuit pattern and the release film to form a hot-pressed laminate; and
    removing the release film from the hot-pressed laminate to expose the circuit pattern.

2. The method of claim 1, further comprising: plating a metal on the circuit pattern between the printing and the applying.

3. The method of claim 2, wherein the plating includes an electro plating or an electroless plating.

4. The method of claim 1, wherein the resin includes an epoxy resin, a urethane resin, a urea resin, a melamine resin, a phenol resin, a silicone resin, a polyimide resin, a polysulfone resin, a polyester resin, or a polyphenylene sulfide resin.

5. The method of claim 1, wherein the heat conductive particles include silicone dioxide ($SiO_2$), titanium dioxide ($TiO_2$), alumina ($Al_2O_3$), barium sulfate ($BaSO_4$), calcium carbonate ($CaCO_3$), Al flake, Ag flake, graphene oxide, graphite oxide, oxidized carbon nanotubes, indium tin oxide (ITO), aluminum nitride (AlN), boron nitride (BN), or magnesium oxide (MgO).

6. The method of claim 1, wherein the hot pressing is performed at 120 to 200° C.

* * * * *